US012473457B2

United States Patent
Dockery et al.

(10) Patent No.: US 12,473,457 B2
(45) Date of Patent: Nov. 18, 2025

(54) COMPOSITION FOR TUNGSTEN CMP

(71) Applicant: Cabot Microelectronics Corporation, Aurora, IL (US)

(72) Inventors: Kevin P. Dockery, Aurora, IL (US); Tyler Carter, Naperville, IL (US); Matthew E. Carnes, Chicago, IL (US); Jessica VanKuiken, Glendale Heights, IL (US); Pankaj Singh, Plainfield, IL (US)

(73) Assignee: CMC MATERIALS LLC, Aurora, IL (US)

( * ) Notice: Subject to any disclaimer, the term of this patent is extended or adjusted under 35 U.S.C. 154(b) by 1197 days.

(21) Appl. No.: 16/131,180

(22) Filed: Sep. 14, 2018

(65) Prior Publication Data

US 2019/0085209 A1 Mar. 21, 2019

Related U.S. Application Data

(60) Provisional application No. 62/559,259, filed on Sep. 15, 2017.

(51) Int. Cl.
| | |
|---|---|
| *C09G 1/02* | (2006.01) |
| *B24B 1/00* | (2006.01) |
| *B24B 37/04* | (2012.01) |
| *C09G 1/00* | (2006.01) |
| *C09G 1/04* | (2006.01) |
| *C09G 1/06* | (2006.01) |
| *C09K 13/06* | (2006.01) |
| *C23F 1/30* | (2006.01) |
| *C23F 3/06* | (2006.01) |
| *H01L 21/306* | (2006.01) |
| *H01L 21/321* | (2006.01) |

(52) U.S. Cl.
CPC ............... *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 13/06* (2013.01); *C23F 1/30* (2013.01); *C23F 3/06* (2013.01); *H01L 21/30625* (2013.01); *H01L 21/3212* (2013.01)

(58) Field of Classification Search
CPC ..... C09G 1/02; C23F 3/06; C23F 1/30; B24B 37/044; C09K 3/1409; C09K 3/1463
See application file for complete search history.

(56) References Cited

U.S. PATENT DOCUMENTS

| | | | |
|---|---|---|---|
| 5,958,288 A | 9/1999 | Mueller | |
| 6,136,711 A | 10/2000 | Grumbine | |
| 7,029,508 B2 | 4/2006 | Scott | |
| 7,077,880 B2 | 7/2006 | Siddiqui | |
| 7,994,057 B2 | 8/2011 | Dysard | |
| 9,028,572 B2 | 5/2015 | Grumbine | |
| 9,238,754 B2 | 1/2016 | Grumbine | |
| 9,422,456 B2 | 8/2016 | Grumbine | |
| 2009/0246957 A1 | 10/2009 | Kamimura | |
| 2010/0075501 A1 | 3/2010 | Abe | |
| 2013/0280910 A1 | 10/2013 | Ihnfeldt | |
| 2015/0259572 A1 | 9/2015 | Grumbine | |
| 2015/0267081 A1 | 9/2015 | Fu et al. | |
| 2015/0376458 A1* | 12/2015 | Grumbine | C09G 1/02 252/79.1 |
| 2016/0251547 A1* | 9/2016 | Park | H01L 21/3212 252/79.4 |
| 2017/0121561 A1 | 5/2017 | Dockery et al. | |
| 2017/0236718 A1 | 8/2017 | Petro | |

FOREIGN PATENT DOCUMENTS

| | | | | |
|---|---|---|---|---|
| JP | 2007273910 | * | 10/2007 | ............... C09G 1/02 |
| WO | 2015114489 A1 | | 8/2015 | |
| WO | 2015200679 A1 | | 12/2015 | |
| WO | 2017162462 A1 | | 9/2017 | |

OTHER PUBLICATIONS

Korean Intellectual Property Office as Isa, International Search Report and Written Opinion of the International Searching Authority issued on Jan. 9, 2019 in connection with Application No. PCT/US2018/051012.
Viktoria Torma et al., A novel potentiometric method for the determination of real crosslinking ratio of poly (aspartic acid) gels, Acta Biomaterialia, Sep. 15, 2009, p. 1186-1190.
Dimitrios Mavrogiorgis et al., Controlled polymerization of histidine and synthesis of well-defined stimuli responsive polymers. Elucidation of the structure—aggregation relationship of this highly multifunctional material, The Royal Society of Chemistry, Jul. 8, 2014, 5, p. 6256-6278.
Etsuo Kokufuta et al., Potentiometric Titration Behavior of a Copolymer of Glutamic Acid and Alanine Prepared by Thermal Polycondensation, BioSystems, Dec. 1978, 10, p. 299-306.
Etsuo Kokufuta et al., Potentiometric Titration Behavior of Polyaspartic Acid Prepared by Thermal Polycondensation, BioSystems, Dec. 1977, 9, p. 211-214.
Lev Bromberg et al., Poly(N-vinylguanidine): Characterization, and catalytic and bactericidal properties, Science Direct, Nov. 1, 2007, 48, p. 7490-7498.
Taiwan Intellectual Property Office, Search Report issued in connection with Taiwan Patent Application No. 107132358 on Apr. 26, 2019.

* cited by examiner

*Primary Examiner* — Jiong-Ping Lu

(57) ABSTRACT

A chemical mechanical polishing composition for polishing a substrate having a tungsten layer includes a water based liquid carrier, abrasive particles dispersed in the liquid carrier, an iron containing accelerator, and a cationic polymer having an amino acid monomer. A method for chemical mechanical polishing a substrate including a tungsten layer includes contacting the substrate with the above-described polishing composition, moving the polishing composition relative to the substrate, and abrading the substrate to remove a portion of the tungsten from the substrate and thereby polish the substrate.

10 Claims, No Drawings

COMPOSITION FOR TUNGSTEN CMP

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (such as tungsten) on a semiconductor substrate may include abrasive particles suspended in an aqueous solution and chemical accelerators such as oxidizers, chelating agents, catalysts, and the like.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition (e.g., by an oxidizing agent and other chemical compounds present in the CMP composition) and/or the mechanical activity of an abrasive suspended in the polishing composition.

In typical tungsten plug and interconnect processes, tungsten is deposited over a dielectric and within openings formed therein. The excess tungsten over the dielectric layer is then removed during a CMP operation to form tungsten plugs and interconnects within the dielectric. As semiconductor device feature sizes continue to shrink, meeting local and global planarity requirements has become more difficult in CMP operations (e.g., in tungsten CMP operations). Array erosion (also referred to as oxide erosion), plug and line recessing (also referred to as dishing), and tungsten etching defects are known to compromise planarity and overall device integrity. For example, excessive oxide erosion and/or dishing may lead to difficulties in subsequent lithography steps as well as cause electrical contact problems that can degrade electrical performance. Tungsten etching/corrosion may also degrade electrical performance or even cause device failure. Thus, there is a need in the industry for tungsten CMP slurries (or compositions) that provide for improved planarity during a tungsten CMP operation.

BRIEF SUMMARY OF THE INVENTION

A chemical mechanical polishing composition for polishing a substrate having a tungsten layer is disclosed. The polishing composition includes a water based liquid carrier, abrasive particles dispersed in the liquid carrier, an iron containing accelerator, and a cationic polymer having an amino acid monomer. In one embodiment, the abrasive particles may include a colloidal silica and the cationic polymer may include polylysine. A method for chemical mechanical polishing a substrate including a tungsten layer is further disclosed. The method may include contacting the substrate with the above described polishing composition, moving the polishing composition relative to the substrate, and abrading the substrate to remove a portion of the tungsten from the substrate and thereby polish the substrate.

DETAILED DESCRIPTION OF THE INVENTION

A chemical mechanical polishing (CMP) composition for polishing a substrate having a tungsten layer is disclosed. The polishing composition includes a water based liquid carrier, abrasive particles dispersed in the liquid carrier, an iron containing accelerator, and a cationic polymer having an amino acid monomer (also referred to herein as a polyamino acid). The CMP composition may include substantially any cationic polymer containing an amino acid monomer unit, including homopolymers and copolymers. Formula (I) depicts an example homopolymer including an amino acid monomer. Copolymers include two or more different monomer units. In suitable copolymers at least one of the monomer units is an amino acid.

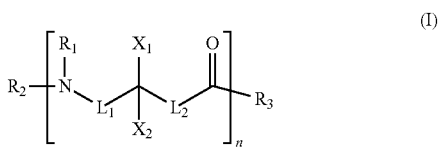

In formula (I), at least one of $L_1$, $L_2$, $X_1$, and $X_2$ includes a positively charged group. Examples of positively charged groups may include titratable amino- and alkyl-amino substituents, which may be protonated at the slurry pH (e.g., protonated at a pH of about 2, or at a pH of about 3, or at a pH of about 4, 5, or 6). The positively charged group may also contain a group with a permanent positive charge such as a tetraalkylammonium group. Non-limiting examples of other nitrogen containing positively charged groups may include imidazolium groups, pyridinium groups, and guanidinium groups, including the titratable and corresponding alkylated salts. Other positively charged groups may include phosphonium groups and/or sulfonium groups. In cases where $X_1$ and/or $X_2$ contain a positively charged group, $L_1$ and/or $L_2$ may optionally be any linking group. In certain compounds in which $X_1$ and/or $X_2$ contain a positively charged group, such as a titratable amino group, $L_1$ and $L_2$ are optional. In certain other compounds in which $L_1$ and/or $L_2$ contain a positively charged group, $X_1$ and $X_2$ may be substantially any group, for example, including hydrogen or an alkyl group. $R_1$, $R_2$, and $R_3$ may be substantially any suitable substituent group including, for example, OH, H, or an alkyl group. $R_2$ and $R_3$ may include substantially any functional group that forms a linkage between the monomer units. The lower-case letter n is used to denote the repeating units of a polymer resulting from the linkage of monomer units.

As noted above, the polyamino acid may be a homopolymer of suitable amino acid monomers such as depicted in formula (I) or a co-polymer including a suitable amino acid monomer with at least one other monomer unit in a suitable fashion. Homopolymer polyamino acids compounds are generally preferred.

In preferred embodiments, the polyamino acid compound includes a titratable group with an acid dissociation constant ($pK_a$) greater than about 5, for example, in a range from about 5 to about 14, or preferably in a range from about 6 to about 11 (or from about 6 to about 8). Table 1 lists several polyamino acids and their corresponding $pK_a$ values. In Table 1, compounds 1-4 have $pK_a$ values in the preferred range. Compounds 5 and 6 have $pK_a$ values less than 5.

TABLE 1

| Compound | Poly-amino acid | pKa | Reference |
|---|---|---|---|
| 1 | α-Poly-L-Lysine | 10.1 | Experimentally Determined |
| 2 | ε-Poly-L-lysine | 7.2 | Experimentally Determined |
| 3 | Poly-L-Arginine | 12.5 | L. Bromberg, et al., Polymer, vol. 48, 2007, pp 7490-7498 |
| 4 | Poly-L-Histidine | 6.5 | D. Mavrogorgis, et al., Polymer Chem., vol. 5, 2014, pp 6256-6277 |
| 5 | α-Poly-L-glutamic acid | 4.6 | E. Kokufuta, et al., Biosystems, vol. 10, 1978, pp 299-306 |
| 6 | Poly-Aspartic acid | 4.4 | E. Kokufuta, et al., BioSystems, vol. 9, 1977, pp 211-214 |

In Table 1, the pKa values of α-poly-L-lysine and ε-poly-L-lysine (compounds 1 and 2) were experimentally determined using potentiometric titrations. The titrations were carried out using a Mettler-Toledo Model T5 autotitrator equipped with a model DG115-SC pH probe, using 0.5 N KOH as a titrant in a 10 mL burette, in endpoint (EP) mode (EP=final pH=pH 12). The autotitrator data collection and analysis were driven by LabX software also from Mettler Toledo. Polylysine solutions were prepared by mixing 52 milligrams polylysine hydrochloride salt (i.e., 4700 Dalton MW α-poly-L-lysine hydrochloride obtained from Alamanda Polymers or ε-poly-L-lysine hydrochloride salt obtained from Bonding Chemical) with 2.5 grams 1N nitric acid (Aldrich Chemicals) and water to obtain a total mass of 150 grams. The mixtures were stirred and then sonicated for 10 minutes. The solutions were autotitrated as described above. The resulting titration data were normalized by subtracting against the corresponding acid control solution in water baseline titration data (acid control=2.5 g of 1 N nitric acid in water to with a total mass of 150 g). The resulting normalized titration data of volume of normalized KOH added vs pH value were fit with non-linear least squares algorithm to provide the experimentally determined pKa values.

In the most preferred embodiments, the polyamino acid compound may include, for example, polylysine, polyarginine, and/or polyhistidine. The abrasive particles may include substantially any suitable abrasive particles, for example, including colloidal silica. In one embodiment, the polishing composition includes a soluble iron containing catalyst, a stabilizer bound to the iron containing catalyst, a colloidal silica, polylysine, and a pH in a range from about 1.0 to about 5.0. The colloidal silica may optionally be treated with a functionalized silane compound to impart a permanent cationic or anionic charge. For example, treating colloidal silica with an aminosilane compound may impart a permanent positive charge.

It will be appreciated that the disclosed CMP compositions may be advantageously utilized for bulk tungsten removal and/or tungsten buff CMP operations (which are sometimes referred to in the art as first and second step tungsten CMP operations). Bulk removal operations may require higher tungsten removal rates while buff operations may require lower defect levels. The disclosed CMP compositions may also be advantageously utilized for single step tungsten CMP operations. The disclosed embodiments are not intended to be limited to any particular CMP operation.

The polishing composition contains abrasive particles suspended in a liquid carrier. The abrasive particles may include substantially any suitable abrasive material such as metal oxide particles, diamond particles, and/or ceramic particles. Metal oxide particles may include, for example, silica and/or alumina abrasive particles. Ceramic particles may include materials such as cubic boron nitride or silicon carbide. The disclosed embodiments are not limited with regard to the abrasive particles.

In certain embodiments (such as in the Examples disclosed below), the abrasive may include colloidal silica, pyrogenic (fumed) silica, or mixtures thereof. As used herein the term colloidal silica particles refers to silica particles that are prepared via a wet process rather than a pyrogenic or flame hydrolysis process which produces structurally different particles. The colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

The abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, Louisiana) or the Zetasizer® available from Malvern Instruments®. The abrasive particles may have an average particle size of about 5 nm or more (e.g., about 20 nm or more, about 40 nm or more, about 50 nm or more, or about 60 nm or more). The abrasive particles may have an average particle size of about 200 nm or less (e.g., about 160 nm or less, about 140 nm or less, about 120 nm or less, or about 100 nm or less). Accordingly, the abrasive particles may have an average particle size in a range from about 5 nm to about 200 nm (e.g., from about 20 nm to about 160 nm, from about 40 nm to about 140 nm, from about 50 nm to about 120 nm, or from about 60 nm to about 100 nm).

The polishing composition may include substantially any suitable amount of the abrasive particles. The polishing composition typically includes about 0.01 wt. % or more abrasive particles (e.g., about 0.05 wt. % or more). More typically, the polishing composition may include about 0.1 wt. % or more (e.g., about 0.2 wt. % or more, about 0.5 wt. % or more, or 1 wt. % or more) abrasive particles. The amount of abrasive particles in the polishing composition is typically about 30 wt. % or less, and more typically about 20 wt. % or less (e.g., about 10 wt. % or less, about 5 wt. % or less, or about 3 wt. % or less). Preferably, the amount of abrasive particles in the polishing composition is in a range from about 0.01 wt. % to about 30 wt. %, and more preferably from about 0.05 wt. % to about 20 wt. % (e.g., from about 0.1 wt. % to about 20 wt. %, from about 0.1 wt.

% to about 10 wt. %, from about 0.1 wt. % to about 5 wt. %, or from about 0.2 wt. % to about 3 wt. %).

A liquid carrier is used to facilitate the application of the abrasive and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

In embodiments in which the abrasive particles comprise silica (such as colloidal or pyrogenic silica) the silica particles may optionally have a positive charge in the polishing composition. The charge on dispersed particles such as silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the Zetasizer available from Malvern Instruments, the ZetaPlus Zeta Potential Analyzer available from Brookhaven Instruments, and/or an electro-acoustic spectrometer available from Dispersion Technologies, Inc.

In certain embodiments, the abrasive particles comprise colloidal silica particles having a permanent positive charge of about 6 mV or more (e.g., about 10 mV or more, about 15 mV or more, or about 20 mV or more). The colloidal silica particles in the polishing composition may have a permanent positive charge of about 50 mV or less (e.g., about 45 mV or less or about 40 mV or less). Preferably, the colloidal silica particles have a permanent positive charge in a range from about 6 mV to about 50 mV (e.g., about 10 mV to about 45 mV, about 15 mV to about 40 mV, or about 20 mV to about 40 mV).

By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica.

Notwithstanding, as used herein, a permanent positive charge of at least 6 mV means that the zeta potential of the colloidal silica particles remains above 6 mV after the three step ultrafiltration test described in further detail in commonly assigned U.S. Pat. No. 9,238,754, which is incorporated by reference herein in its entirety.

Colloidal silica particles having a permanent positive charge in the polishing composition may be obtained, for example, via treating the particles with at least one aminosilane compound as disclosed in commonly assigned U.S. Pat. Nos. 7,994,057 and 9,028,572. Alternatively, colloidal silica particles having a permanent positive charge in the polishing composition may be obtained by incorporating a chemical species, such as an aminosilane compound, in the colloidal silica particles as disclosed in in commonly assigned U.S. Pat. No. 9,422,456.

The polishing composition is generally acidic having a pH of less than about 7. The polishing composition typically has a pH of about 1 or more (e.g., about 1.5 or more, about 2 or more, about 2.5 or more, or about 3 or more). Preferably, the polishing composition has a pH of about 6 or less (e.g., about 5 or less, about 4.5 or less, about 4 or less, or about 3.5 or less). The polishing composition may thus have a pH in a range from about 1 to about 6 (e.g., from about 2 to about 5, from about 2 to about 4.5, or from about 2.5 to about 4.5). Polishing compositions used for bulk tungsten removal may preferably have a pH in a range from about 2 to about 4 (e.g., from about 2 to about 3.5). Polishing compositions used for a tungsten buffing operation may preferably have a pH in a range from about 3 to about 5 (e.g., from about 3 to about 4.5). The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

Optional embodiments of the polishing composition may further include an iron containing accelerator. An iron containing accelerator as used herein is an iron containing chemical compound that increases the removal rate of tungsten during a tungsten CMP operation. For example, the iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle.

The amount of iron containing accelerator in the polishing composition may be varied depending upon the oxidizing agent used and the chemical form of the accelerator. When the preferred oxidizing agent hydrogen peroxide (or its analogs) is used and a soluble iron containing catalyst is used (such as ferric nitrate), the catalyst may be present in the composition in an amount sufficient to provide a range from about 0.5 to about 3000 ppm Fe based on the total weight of the composition. The polishing composition may include about 1 ppm Fe or more (e.g., about 2 ppm or more, about 5 ppm or more, or about 10 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 2 to about 200 ppm, from about 5 to about 100 ppm, or from about 10 to about 50 ppm). Polishing compositions used for bulk tungsten removal may preferably include from about 5 to about 50 ppm Fe (e.g., from about 10 to about 40 ppm Fe). Polishing compositions used for a tungsten buffing operation may preferably include from about 0.5 to about 20 ppm Fe (e.g., from about 1 to about 10 ppm Fe).

Embodiments of the polishing composition including an iron containing accelerator may further include a stabilizer. Without such a stabilizer, the iron containing accelerator and the oxidizing agent, if present, may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agents is hydrogen peroxide.

The oxidizing agent may be present in the polishing composition in an amount ranging, for example, from about 0.1 to about 10 weight percent. In preferred embodiments in which a hydrogen peroxide oxidizer and a soluble iron containing accelerator are used, the oxidizer may be present in the polishing composition in an amount ranging from about 0.1 to about 6 weight percent (e.g., from about 0.2 to about 5 weight percent, from about 0.3 to about 4 weight percent, or from about 0.5 to about 3 weight percent).

The polishing composition further includes cationic polymer having an amino acid monomer unit (also referred to herein as a polyamino acid compound) in solution in the liquid carrier. It will be appreciated that polyamino acid compounds are polymers derived from amino acid monomers. The polyamino acid compounds are intended to inhibit tungsten plug and line recessing (i.e., dishing) and in particular tungsten line (interconnect) recessing as well as reduce array erosion. Suitable polyamino acid compounds may further (although not necessarily) inhibit tungsten etching. Substantially any suitable polyamino acid may be employed, for example, those disclosed above according to formula (I). Such suitable polyamino acids may include polyarginine, polyornithine, polyhistidine, and polylysine. Preferred polyamino acid compounds include polylysine, polyarginine, and polyhistidine. Most preferred polyamino acid compounds include polylysine.

It will be understood that polylysine may include ε-polylysine and/or α-polylysine composed of D-lysine and/or L-lysine. The polylysine may thus include α-poly-L-lysine, α-poly-D-lysine, ε-poly-L-lysine, ε-poly-D-lysine, and mixtures thereof. In certain preferred embodiments, the polylysine is ε-poly-L-lysine. It will further be understood that the polyamino acid compound (or compounds) may be used in any accessible form, e.g., the conjugate acid or base and salt forms of the polyamino acid may be used instead of (or in addition to) the polyamino acid. The term "acid" as it is used in this context to describe useful polyamino acid additives is intended to mean the polyamino acid and any form that can be accessed by adjusting the pH to modify any titratable functional groups that may be present. Such forms include its conjugate base or acid and any other salt thereof. For example, the term "polylysine" means the polylysine amino acid as well as its conjugate acid formed by protonating the amine functional group.

Polyamino acid compounds may have substantially any suitable molecular weight and polydispersity index. For example, the polyamino acid may have a molecular weight in a range from about 1 to about 100 kDa. It will be understood, however, that the disclosed embodiments are not limited by the molecular weight or the polydispersity index of the polyamino acid compounds.

The amount of polyamino acid compound in the polishing composition may be varied depending upon the particular polyamino acid used, the oxidizing agent used, and the chemical form of the accelerator. When the preferred polyamino acid, polylysine, is used (e.g., ε-poly-L-lysine) and the preferred hydrogen peroxide oxidizer and soluble iron containing catalyst are used, the polylysine may be present in the composition in an amount ranging from about 1 to about 1000 ppm based on the total weight of the composition. The polishing composition preferably includes about 1 ppm polylysine or more (e.g., about 5 ppm or more, about 10 ppm or more, about 15 ppm or more or about 20 ppm or more). The polishing composition preferably includes about 1000 ppm polylysine or less (e.g., about 500 ppm or less, about 200 ppm or less, about 100 ppm or less, about 75 ppm or less, about 50 ppm or less, or about 25 ppm or less). The polishing composition may thus include a range from about 1 to about 1000 ppm polylysine (e.g., from about 1 to about 500 ppm, from about 1 to about 200 ppm, from about 1 to about 100, from about 1 to about 50, from about 5 to about 500 ppm, from about 5 to about 200 ppm, from about 5 to about 100 ppm, from about 5 to about 50, or from about 5 to about 25 ppm polylysine.

The polishing composition may optionally include a compound that provides further tungsten etching inhibition (i.e., in addition to any tungsten etch inhibition provided by the polyamino acid). Such optional compounds (when included) are intended to inhibit the conversion of solid tungsten into soluble tungsten compounds while at the same time allowing for effective removal of solid tungsten via the CMP operation. Classes of compounds that may be useful include compounds having nitrogen-containing functional groups such as nitrogen-containing heterocycles, alkyl ammonium ions, amino alkyls, and amino acids. Suitable inhibitors of tungsten etching are disclosed in more detail in U.S. Pat. Nos. 6,136,711 and 9,238,754.

The polishing composition may optionally further include a biocide. The biocide may include any suitable biocide, for example an isothiazolinone biocide. The amount of biocide in the polishing composition typically is in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the iron containing accelerator, the polyamino acid, etc.)

For example, the silica may be dispersed in the aqueous liquid carrier. Other components such as an iron containing accelerator, a stabilizer, the polyamino acid, and a biocide may then be added and mixed by any method that is capable of incorporating the components into the polishing composition. The oxidizing agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include abrasive particles, the polyamino acid compound, the optional iron containing accelerator and stabilizer, the optional biocide, and water, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, abrasive particles, the polyamino acid compound, and the optional iron containing accelerator and stabilizer, may each be present in the polishing composition in an amount that is about 2 times (e.g., about 3 times, about 4 times, or about 5 times) greater than the concentration recited above for each component so that, when the concentrate is diluted with an equal volume of (e.g., 1 equal volume of water, 2 equal volumes of water, 3 equal volumes of water, or even 4 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

It will be understood that the disclosure includes numerous embodiments. These embodiments include, but are not limited to, the following embodiments.

In a first embodiment a chemical mechanical polishing composition includes: a water based liquid carrier; abrasive particles dispersed in the liquid carrier, an iron containing accelerator; and a cationic polymer having an amino acid monomer unit.

A second embodiment may include the first embodiment wherein the abrasive particles comprise a colloidal silica abrasive.

A third embodiment may include the second embodiment wherein the colloidal silica abrasive has a permanent positive charge of at least 10 mV.

A fourth embodiment may include any one of the first three embodiments wherein the iron containing accelerator comprises a soluble iron containing catalyst.

A fifth embodiment may include the fourth embodiment and further include a stabilizer bound to the soluble iron containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A sixth embodiment may include any one of the first five embodiments and further include a hydrogen peroxide oxidizer.

A seventh embodiment may include any one of the first six embodiments and have a pH in a range from about 1.0 to about 5.0.

An eighth embodiment may include any one of the first seven embodiments wherein the cationic polymer comprises a compound according to the following formula

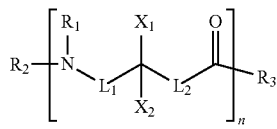

wherein at least one of $L_1$, $L_2$, $X_1$, and $X_2$ includes a positively charged group and $R_1$, $R_2$, and $R_3$ is H, OH, or an alkyl group.

A ninth embodiment may include the eighth embodiment wherein the cationic polymer has an acid dissociation constant ($pK_a$) greater than about 5.

A tenth embodiment may include the eighth embodiment wherein the cationic polymer has an acid dissociation constant ($pK_a$) of 6-11.

An eleventh embodiment may include the eighth embodiment wherein the cationic polymer comprises at least one of polylysine, polyarginine, and polyhistidine.

A twelfth embodiment may include the eleventh embodiment wherein the cationic polymer comprises polylysine.

A thirteenth embodiment may include the twelfth embodiment wherein the cationic polymer comprises ε-poly-L-lysine.

A fourteenth embodiment may include the eighth embodiment including from about 1 to about 200 ppm by weight of the cationic polymer.

A fifteenth embodiment may include the eighth embodiment including from about 5 to about 50 ppm by weight of the cationic polymer.

A sixteenth embodiment may include the eighth embodiment wherein the cationic polymer has a molecular weight in a range from about 1 to about 100 kDa.

In a seventeenth embodiment a chemical mechanical polishing composition includes: a water based liquid carrier; colloidal silica abrasive particles dispersed in the liquid carrier, a soluble iron containing catalyst; a stabilizer bound to the soluble iron containing catalyst; a cationic polymer having an amino acid monomer unit, the cationic polymer comprising at least one of polylysine, polyarginine, and polyhistidine; wherein the composition has a pH in a range from about 1 to about 5.

An eighteenth embodiment may include the seventeenth embodiment wherein the cationic polymer is polylysine.

In a nineteenth embodiment a method of chemical mechanical polishing a substrate including a tungsten layer includes (a) contacting the substrate with a polishing composition comprising: (i) a water based liquid carrier; (ii) abrasive particles dispersed in the liquid carrier; (iii) an iron containing accelerator; and (iv) a cationic polymer having an amino acid monomer unit; (b)moving the polishing composition relative to the substrate; and (c) abrading the substrate to remove a portion of the tungsten from the substrate and thereby polish the substrate.

A twentieth embodiment may include the nineteenth embodiment wherein the abrasive particles comprise a colloidal silica having a permanent positive charge of at least 10 mV.

A twenty-first embodiment may include the nineteenth or twentieth embodiments wherein: (i) the iron containing accelerator comprises a soluble iron containing catalyst; and (ii) the polishing composition further comprises a stabilizer bound to the soluble iron containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A twenty-second embodiment may include any one of the nineteenth through the twenty-first embodiments wherein: (i) the polishing composition further comprises a hydrogen peroxide oxidizer; and (ii) the polishing composition has a pH in a range from about 1.0 to about 5.0.

A twenty-third embodiment may include any one of the nineteenth through the twenty-second embodiments wherein the cationic polymer comprises at least one of polylysine, polyarginine, and polyhistidine.

A twenty-fourth embodiment may include the twenty-third embodiment wherein the cationic polymer comprises polylysine.

A twenty-fifth embodiment may include the twenty-third embodiment including from about 1 to about 200 ppm by weight of the cationic polymer.

The following examples further illustrate the invention but, of course, should not be construed as in any way limiting its scope.

EXAMPLE 1

Nine polishing compositions were prepared (Controls A and B and Examples 1A, 1B, 1C, 1D, 1E, 1F, and 1G) as concentrates that were diluted 2:1 with water immediately before use. Compositions 1A-1G included various concentrations of ε-poly-L-lysine (ranging from 30 to 3000 ppm by weight). Each of the nine polishing compositions was prepared by adding a concentrated colloidal silica (such as are commercially available from Akzo Nobel, Fuso, and Nalco) to a mixture including malonic acid, ferric nitrate, TBAH (tetrabutylammonium hydroxide), an appropriate quantity of ε-poly-L-lysine, and a Kathon® biocide. The colloidal silica had an average particle size of 120 nm. Control A included no ε-poly-L-lysine. Control B included 3000 ppm by weight lysine in place of the ε-poly-L-lysine. Each of the nine polishing compositions included 2700 ppm by weight tetrabutyl ammonium hydroxide (TBAH), 81 ppm by weight malonic acid, 3.7 ppm by weight ferric nitrate nonahydrate (Fe(NO$_3$)$_3$.9H$_2$O), 7.5 weight percent colloidal silica, and 15 ppm by weight Kathon LX. The pH was adjusted to 3.05 using nitric acid. The concentrations of ε-poly-L-lysine varied as described in more detail below.

The tungsten etch rate of each of the above-described nine polishing compositions was evaluated. This example demonstrates the effect of ε-poly-L-lysine on the tungsten etch rate. To obtain the tungsten etch rate for each polishing composition, the composition was first diluted one part polishing composition to two parts deionized water. The polishing compositions were then heated to 45 degrees C. after which hydrogen peroxide was added to a concentration of 0.5 weight percent. After waiting 5 minutes for the temperature to return to 45 degrees C., two-inch wafers having a tungsten layer were submersed in the polishing compositions (tungsten side up) for 5 minutes. Tungsten removal rates were determined via resistivity measurements made before and after immersion in the polishing compositions.

The tungsten etch rates are shown in Table 2. Control A included no ε-poly-L-lysine or lysine. Control B included no ε-poly-L-lysine and 1000 ppm by weight lysine (after dilution). Compositions 1A-1G included 10 ppm (1A), 25 ppm (1B), 50 ppm (1C), 100 ppm (1D), 250 ppm (1E), 500 ppm (1F), and 1000 ppm (1G) of ε-poly-L-lysine as indicated in Table 2. All ε-poly-L-lysine concentrations listed in Table 2 were after 2:1 dilution with deionized water.

TABLE 2

| Polishing Composition | [ε-poly-L-lysine], ppm by weight | W Etch Rate, Å/min |
|---|---|---|
| Control A | 0 | 143.7 |
| Control B | 0 | 28.3 |
| 1A | 10 | 120.9 |
| 1B | 25 | 150.4 |
| 1C | 50 | 6.9 |
| 1D | 100 | 2.6 |
| 1E | 250 | 1.6 |
| 1F | 500 | 0.4 |
| 1G | 1000 | 2.1 |

As is apparent from the results set forth in Table 2, compositions 1C-1G, which included ε-poly-L-lysine concentrations ranging from 50 to 1000 ppm by weight, exhibited W etch rates of one-twentieth or less than that of control A (no inhibitor) and one-fourth or less than that of control B (1000 ppm by weight lysine).

EXAMPLE 2

Twenty-four polishing compositions were prepared (Examples 2A through 2X). The prepared polishing compositions were identical with the exception of the additive type and concentration. The tungsten etch rates were measured for each polishing composition, with the effect of the additive being evaluated. The tungsten etch rates were measured using the same procedure as described above in Example 1 (with hydrogen peroxide being added to a concentration of 0.5 weight percent as also described in Example 1).

Each of the polishing compositions was prepared by adding a concentrated colloidal silica (Fuso® PL-2) to a mixture including malonic acid, ferric nitrate, and a Kathon® biocide such that the colloidal silica concentration was 3.0 weight percent. Each of the polishing compositions included 25 ppm by weight malonic acid, 12 ppm by weight ferric nitrate nonahydrate (Fe(NO$_3$)$_3$.9H$_2$O), and 15 ppm by weight Kathon LX. The pH was adjusted to 2.5 using nitric acid. The appropriate additive compound was then added to the polishing composition prior to etch testing. Additive concentrations were either 50 or 100 ppm by weight.

Table 3 lists the additive compounds and corresponding concentrations as well as the measured tungsten etch rates for each polishing composition. As is apparent from the results set forth in Table 3, polishing compositions 2A/2B, 2O/2P, and 2Q/2R, which included ε-polylysine and α-polylysine additives, exhibited very low tungsten static etch rates. Moreover polishing compositions 2S/2T and 2W/2X, which included polyhistidine and polyarginine additives, also exhibited very low tungsten static etch rates.

TABLE 3

| Polishing Composition | Additive Concentration, ppm by weight | W Etch Rate, Å/min |
|---|---|---|
| 2A | 50 ppm ε-Polylysine | 0 |
| 2B | 100 ppm ε-Polylysine | 1.1 |
| 2C | 50 ppm Polyvinyl alcohol | 142.6 |
| 2D | 100 ppm Polyvinyl alcohol | 158.4 |
| 2E | 50 ppm Polyvinyl pyrrolidone | 113.6 |
| 2F | 100 ppm Polyvinyl pyrrolidone | 115.6 |
| 2G | 50 ppm Poly acrylic acid | 289.7 |
| 2H | 100 ppm Poly acrylic acid | 203.5 |
| 2I | 50 ppm Polyethylene glycol | 136.9 |
| 2J | 100 ppm Polyethylene glycol | 133.9 |
| 2K | 50 ppm Polyaspartic acid | 338 |
| 2L | 100 ppm Polyaspartic acid | 318.5 |
| 2M | 50 ppm Polyglutamic acid | 289.2 |
| 2N | 100 ppm Polyglutamic acid | 321.3 |
| 2O | 50 ppm α-Polylysine, 4 kDa MW | 1.3 |
| 2P | 100 ppm α-Polylysine, 4 kDa MW | 3.7 |
| 2Q | 50 ppm α-Polylysine, 66 kDa MW | 30.5 |
| 2R | 100 ppm α-Polylysine, 66 kDa MW | 4.9 |
| 2S | 50 ppm Polyhistidine | 2.7 |
| 2T | 100 ppm Polyhistidine | 1.7 |
| 2U | 50 ppm Polyglycine | 137.7 |
| 2V | 100 ppm Polyglycine | 233.7 |
| 2W | 50 ppm Polyarginine | 1.8 |
| 2X | 100 ppm Polyarginine | 1.4 |

EXAMPLE 3

Tungsten polishing rate and line recessing (dishing) were evaluated in this example for three polishing compositions. This example demonstrates the inhibitive effect of polylysine on dishing during a tungsten CMP operation. The CMP compositions were obtained using a procedure similar to that described above with respect to Example 1 (in that a concentrated colloidal silica was added to a mixture including malonic acid and ferric nitrate). Each of the three polishing compositions included 445 ppm by weight malonic acid, 206 ppm by weight ferric nitrate nonahydrate (Fe(NO$_3$)$_3$.9H$_2$O), 0.33 weight percent of a cationic, aminosilane treated colloidal silica (prepared as disclosed in U.S. Pat. Nos. 7,994,057 and 9,028,572), 15 ppm by weight Kathon LX and 2.0 weight percent hydrogen peroxide at a pH of 2.3 (pH adjusted using nitric acid). The treated colloidal silica had an average particle size of 120 nm. The Control C polishing composition included no further ingredients. The Control D polishing composition included 25 ppm by weight of the cationic polymer polydiallyldimethylammonium chloride (polyDADMAC). Polishing composition 3A included 25 ppm by weight of ε-poly-L-lysine.

The tungsten polishing rate was obtained by polishing a blanket tungsten wafer. The line recessing values were obtained by polishing 2k Silyb 854 tungsten patterned wafers with a combined titanium/titanium nitride barrier layer (available from Silyb Wafer Services). The wafers were polished using a Mirra® CMP polishing tool and a NexPlanar® E6088 polishing pad at a downforce of 2.0 psi, a platen speed of 115 rpm, and a head speed of 121 rpm. The slurry flow rate was 90 ml/min. Each patterned wafer was polished to optical End-Point plus an additional 30% overpolish. The line recessing values were obtained using atomic force microscope (AFM) profilometer measurements across a 1×1 micron line feature. The tungsten polishing rates and line recessing values are shown in Table 4.

TABLE 4

| Polishing Composition | W Polishing Rate, Å/min | Line Recessing, Å |
|---|---|---|
| Control C | 3590 | 438 |
| Control D | 2840 | 305 |
| 3A | 2900 | 115 |

As is apparent from the results set forth in Table 4, the use ε-poly-L-lysine reduces line recessing by nearly a factor of four as compared to Control C and nearly a factor of three as compared to control D.

EXAMPLE 4

Tungsten polishing rate and line recessing (dishing) were evaluated in this example for nine polishing compositions. This example demonstrates the effect of cationic polyamino acids on dishing during a tungsten CMP operation. The CMP compositions were obtained using a procedure similar to that described above with respect to Example 1 (in that a concentrated colloidal silica was added to a mixture including malonic acid and ferric nitrate). Each of the polishing compositions included 445 ppm by weight malonic acid, 206 ppm by weight ferric nitrate nonahydrate (Fe(NO$_3$)$_3$.9H$_2$O), 0.33 weight percent of a cationic, aminosilane treated colloidal silica (prepared as disclosed in U.S. Pat. Nos. 7,994,057 and 9,028,572), 15 ppm by weight Kathon LX and 2.0 weight percent hydrogen peroxide at a pH of 2.3 (pH adjusted using nitric acid). The treated colloidal silica had an average particle size of 120 nm.

The Control C polishing composition included no further ingredients. The Control E polishing composition included 500 ppm by weight of L-lysine. The other polishing compositions contained a polymer (or inhibitor) whose dose was adjusted such that all compounds were present in an equimolar amount of monomer. The Control F polishing composition included 8.6 ppm by weight of α-poly-L-aspartic acid. The Control G polishing composition included 9.3 ppm by weight of α-poly-L-glutamic acid.

Polishing compositions 4A-4E included 10 ppm by weight of ε-poly-L-lysine (4A), 10 ppm by weight of α-poly-D-lysine (4B), 11.5 ppm by weight of α-poly-L-arginine hydrochloride (4C), 10 ppm by weight of 4700 Dalton MW α-poly-L-lysine hydrochloride (4D), and 12.5 ppm by weight of 66,000 Da MW α-poly-L-lysine hydrobromide (4E) respectively. Table 5 shows polyamino acid pKa values for Control F, Control G, and compositions 4A-4E. These values were obtained from Table 1. The values for compositions 4B and 4E were assumed to be identical to that of composition 4D which is given in Table 1.

The tungsten polishing rate was obtained by polishing a blanket tungsten wafer. The line recessing values were obtained by polishing 2k Silyb 854 tungsten patterned wafers with a titanium nitride barrier layer (available from Silyb Wafer Services). The wafers were polished using a Mirra® CMP polishing tool and a NexPlanar® E6088 polishing pad at a downforce of 2.0 psi, a platen speed of 115 rpm, and a head speed of 121 rpm. The slurry flow rate was 90 ml/min. Each patterned wafer was polished to optical end-point plus an additional 30% overpolish. The line recessing values were obtained using atomic force microscope (AFM) profilometer measurements across a 1×1 micron line feature. The tungsten polishing rates and line recessing values are shown in Table 5.

TABLE 5

| Polishing Composition | pKa | W Polishing Rate (Å/min) | Tungsten Line Recess (Å) |
|---|---|---|---|
| Control C | N/A | 3056 | 400 |
| Control E | N/A | 1065 | 92 |
| Control F | 4.4 | 2513 | 306 |
| Control G | 4.6 | 2604 | 290 |
| 4A | 7.2 | 2135 | −54 |
| 4B | 10.1 | 2390 | 77 |
| 4C | 12.1 | 2345 | 181 |
| 4D | 10.1 | 2406 | 119 |
| 4E | 10.1 | 2405 | 145 |

Note:
Typical measurement uncertainty for W recess is ±50 Å.

As is apparent from the results set forth in Table 5, the use of non-cationic poly-amino acids with pK$_a$<5 (Control F & G) do not significantly reduce tungsten line recess compared to the example containing no inhibitor (Control C). While, the non-polymerized amino acid L-lysine (Control E) reduces line recess to the same degree as polishing compositions 4B-4E, the tungsten removal rate was observed to decrease by greater than 50%. In contrast to Control E, polishing compositions 4A-4E, achieved a significant reduction in line recessing as compared to Control C without a corresponding decrease in the tungsten polishing rate. In the best example, use ε-poly-L-lysine resulted in tungsten protrusion (negative recess), which is a highly desirable characteristic for many integration schemes. Comparing examples 4B, 4D, and 4E further demonstrates that changes to the polymer molecular weight and stereochemistry do not significantly effect tungsten CMP performance.

EXAMPLE 5

Tungsten polishing rate and line recessing (dishing) were evaluated in this example for five polishing compositions. This example demonstrates the effect of ε-poly-L-lysine concentration on tungsten polishing rate and dishing during a tungsten CMP operation. The CMP compositions were obtained using a procedure similar to that described above with respect to Example 1 (in that a concentrated colloidal silica was added to a mixture including malonic acid and ferric nitrate). Each of the polishing compositions included 445 ppm by weight malonic acid, 206 ppm by weight ferric nitrate nonahydrate (Fe(NO$_3$)$_3$.9H$_2$O), 0.33 weight percent of a cationic, aminosilane treated colloidal silica (prepared as disclosed in U.S. Pat. Nos. 7,994,057 and 9,028,572), 15 ppm by weight Kathon LX and 2.0 weight percent hydrogen peroxide at a pH of 2.3 (pH adjusted using nitric acid). The treated colloidal silica had an average particle size of 120 nm. The Control C polishing composition included no further ingredients (i.e., included no ε-poly-L-lysine). Polishing compositions 5A-5D included 12 ppm (5A), 25 ppm (5B), 50 ppm (5C), and 75 ppm (5D) ε-poly-L-lysine as indicated in Table 6.

The tungsten polishing rate was obtained by polishing a blanket tungsten wafer. The line recessing values were obtained by polishing 2k Silyb 854 tungsten patterned wafers with a titanium nitride barrier layer (available from Silyb Wafer Services). The wafers were polished using a Mirra® CMP polishing tool and a NexPlanar® E6088 polishing pad at a downforce of 2.0 psi, a platen speed of 115 rpm, and a head speed of 121 rpm. The slurry flow rate was 90 ml/min. Each patterned wafer was polished to optical end-point plus an additional 30% overpolish. The line recessing values were obtained using atomic force microscope (AFM) profilometer measurements across a 1×1 micron line feature. The tungsten polishing rates and line recessing values are shown in Table 5.

TABLE 6

| Polishing Composition | ε-poly-L-lysine (ppm) | W Polishing Rate (Å/min) | Tungsten Line Recess (Å) |
| --- | --- | --- | --- |
| Control C | 0 | 3056 | 400 |
| 5A | 12 | 2058 | 50 |
| 5B | 25 | 1683 | −20 |
| 5C | 50 | 554 | −20 |
| 5E | 75 | 514 | No End Point |

As is apparent from the results set forth in Table 6, additions of ε-poly-L-lysine significantly reduce the tungsten line recessing. In this particular example formulation, compositions having an ε-poly-L-lysine concentration of less than or equal to 25 ppm are preferred.

EXAMPLE 6

Tungsten, TEOS, and patterned field oxide polishing rate as well as line erosion and line recessing (dishing) were evaluated in this example for two buff polishing compositions. This example demonstrates the effect of ε-poly-L-lysine in reducing line erosion during a tungsten buff CMP operation. Each of the two polishing compositions included 100 ppm by weight malonic acid, 54 ppm by weight ferric nitrate nonahydrate ($Fe(NO_3)_3 \cdot 9H_2O$), 2 weight percent of a cationic, colloidal silica (prepared as disclosed in Example 13 of commonly assigned U.S. Pat. No. 9,422,456), 15 ppm by weight Kathon LX and 0.80 weight percent hydrogen peroxide at a pH of 4.4 (pH adjusted using nitric acid). Polishing composition 7A and also contained an additional 1600 ppm glycine while polishing composition 7B contained an additional 25 ppm of ε-poly-L-Lysine.

The tungsten and TEOS polishing rates were obtained by polishing blanket tungsten and TEOS wafers. The pattern oxide field removal rates, erosion values, and line recessing values were obtained by polishing 2k Silyb 854 tungsten patterned wafers using an Applied Materials 200 mm Mirra® polishing tool and a NexPlanar® E6088 polishing pad. The Silyb 854 tungsten patterned wafers were pre-polished (prepared) with a commercial W8051 (2% H2O2) bulk slurry available from Cabot Microelectronics. The tungsten buff polishing conditions were as follows: downforce=2.5 psi, platen speed=100 rpm, head speed=101 rpm, and slurry flow rate=50 mL/min. The pattern polish times shown in Table 7 were based on blanket TEOS removal rates, targeting a 500 Å TEOS removal on the pattern. The erosion and line recessing values were obtained using atomic force microscope (AFM) profilometer measurements across a 3×1 micron line feature. The blanket and pattern polishing results are set forth in Table 7.

TABLE 7

| Polishing Composition | Tungsten Rate (Å/min) | TEOS Rate (Å/min) | Pattern Time (sec) | Field Oxide Rate (Å/min) | Erosion 3 × 1 μm line (Å) | Recessing 3 × 1 μm line (Å) |
| --- | --- | --- | --- | --- | --- | --- |
| 7A | 1337 | 1781 | 17 | 1234 | 322 | −172 |
| 7B | 1369 | 918 | 33 | 1563 | 56 | −191 |

As is apparent from the results set forth in Table 7, additions of ε-poly-L-lysine significantly reduce the oxide erosion while maintaining highly favorable line protrusion.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
    a water based liquid carrier;
    abrasive particles dispersed in the liquid carrier, wherein the abrasive particles comprise a colloidal silica abrasive, and the colloidal silica abrasive has a permanent positive charge of at least 10 mV, wherein the permanent positive charge is obtained by incorporating an aminosilane compound in the colloidal silica particles;
    an iron containing accelerator, wherein the iron containing accelerator is a soluble iron containing catalyst present in the composition in an amount sufficient to provide a range from about 0.5 to about 20 ppm Fe based on the total weight of the composition;
    a hydrogen peroxide oxidizer; and
    a cationic polymer having an amino acid monomer unit, wherein the cationic polymer comprises at least one of polylysine, polyarginine, and polyhistidine.

2. The composition of claim 1, further comprising a stabilizer bound to the soluble iron containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

3. The composition of claim 1, having a pH in a range from about 1.0 to about 5.0.

4. The composition of claim 1, wherein the cationic polymer comprises polylysine.

5. The composition of claim 4, wherein the cationic polymer comprises ε-poly-L-lysine.

6. The composition of claim 1, comprising from about 1 to about 200 ppm by weight of the cationic polymer.

7. The composition of claim 1, comprising from about 5 to about 50 ppm by weight of the cationic polymer.

8. The composition of claim 1, wherein the cationic polymer has a molecular weight in a range from about 1 to about 100 kDa.

9. A chemical mechanical polishing composition comprising:
    a water based liquid carrier;
    colloidal silica abrasive particles dispersed in the liquid carrier, wherein the colloidal silica abrasive has a permanent positive charge of at least 10 mV, and wherein the permanent positive charge is obtained by incorporating an aminosilane compound in the colloidal silica particles;
    a soluble iron containing catalyst present in the composition in an amount sufficient to provide a range from about 0.5 to about 20 ppm Fe based on the total weight of the composition;
    a hydrogen peroxide oxidizer;
    a stabilizer bound to the soluble iron containing catalyst;
    a cationic polymer having an amino acid monomer unit, the cationic polymer comprising at least one of polylysine, polyarginine, and polyhistidine; and
    wherein the composition has a pH in a range from about 1 to about 5.

10. The composition of claim 9, wherein the cationic polymer is polylysine.

* * * * *